(12) United States Patent
Joo

(10) Patent No.: US 8,982,439 B2
(45) Date of Patent: Mar. 17, 2015

(54) SOLAR LIGHT CONCENTRATION PLATE

(75) Inventor: Won-Jae Joo, Seongnam-si (KR)

(73) Assignee: Samsung Electronics Co., Ltd. (KR)

(*) Notice: Subject to any disclaimer, the term of this patent is extended or adjusted under 35 U.S.C. 154(b) by 426 days.

(21) Appl. No.: 13/182,941

(22) Filed: Jul. 14, 2011

(65) Prior Publication Data

US 2012/0194886 A1 Aug. 2, 2012

(30) Foreign Application Priority Data

Feb. 1, 2011 (KR) .................. 10-2011-0010211

(51) Int. Cl.
- *G02B 5/32* (2006.01)
- *F24J 2/06* (2006.01)
- *H01L 31/052* (2014.01)
- *G02B 5/20* (2006.01)
- *F21V 8/00* (2006.01)

(52) U.S. Cl.
CPC . *G02B 5/32* (2013.01); *F24J 2/067* (2013.01); *H01L 31/0525* (2013.01); *G02B 5/203* (2013.01); *G02B 6/0046* (2013.01); *Y02E 10/40* (2013.01); *Y02E 10/52* (2013.01)
USPC ................................ 359/15; 359/34; 385/146

(58) Field of Classification Search
None
See application file for complete search history.

(56) References Cited

U.S. PATENT DOCUMENTS

| | | | |
|---|---|---|---|
| 6,169,614 | B1 | 1/2001 | Whitcomb et al. |
| 2006/0176533 | A1 | 8/2006 | Sekine et al. |
| 2008/0049450 | A1 | 2/2008 | Sampsell |
| 2009/0199893 | A1 | 8/2009 | Bita et al. |
| 2010/0133422 | A1* | 6/2010 | Lin et al. ............... 250/227.11 |
| 2010/0186818 | A1 | 7/2010 | Okorogu et al. |
| 2010/0329619 | A1* | 12/2010 | Moore et al. ................ 385/129 |
| 2012/0147443 | A1* | 6/2012 | Joo .................................. 359/15 |

FOREIGN PATENT DOCUMENTS

| | | |
|---|---|---|
| KR | 1020090047548 | 5/2009 |
| WO | 2009102671 | 8/2009 |

* cited by examiner

*Primary Examiner* — Derek S Chapel
(74) *Attorney, Agent, or Firm* — Cantor Colburn LLP

(57) ABSTRACT

A solar light concentration plate comprises a first hologram which receives solar light and diffracts incident light in a range of an incident angle, and first and second light guides respectively disposed on both sides of the first hologram, wherein at least one of the first and second light guides has an outer surface substantially inclined to an inner surface of the at least one of the first and second light guides.

12 Claims, 14 Drawing Sheets

SOLAR LIGHT CONCENTRATION PLATE

CROSS-REFERENCE TO RELATED APPLICATIONS

This application claims priority to Korean Patent Application No. 10-2011-0010211 filed on Feb. 1, 2011, and all the benefits accruing therefrom under 35 U.S.C. §119, the entire content of which in its entirety is herein incorporated by reference.

BACKGROUND

1) Field

Provided is a solar light concentration plate.

2) Description of the Related Art

A main energy source that is currently used is a fossil fuel such as coal and petroleum. However, continued use of the fossil fuel causes problems such as global warming and environmental pollution as well as resource exhaustion. Accordingly, use of renewable energy sources such as solar light, tidal power, wind power, and geothermal heat have been suggested as an alternative energy source for replacing the fossil fuel, which causes environmental pollution.

Among the renewable energy sources, technology of converting the solar light into electricity is most widely used. Various materials and devices are being developed for the efficient conversion of the solar light into electricity. For example, recently suggested technology based on the multi-layered p-n junction structure and III-V Group materials accomplishes light conversion efficiency of about 40%.

Furthermore, the solar light can be directly used instead of being converted into electricity. For example, direct use of the solar light as an indoor illumination by collecting the solar light by a light-collecting device installed on a rooftop of a building and transmitting the solar light inside the building using a light guide has been suggested. The direct use of the solar light transmitted from the rooftop as an indoor illumination may greatly reduce electricity consumption. In general, however, natural lighting is insufficient to be used inside the building and thus artificial illuminations are used even in the daytime.

Therefore, efficient light concentration is the core technology that can be applied to various fields that utilize solar light. A currently-available light concentration plate usually includes a large number of silicon photoelectric conversion devices, thereby having a large area which may not be suitable for a mass production due to high cost.

Therefore, it has been suggested that an optical device such as lens is used for focusing the solar light on a photoelectric conversion device to increase an amount of light in a given area and to reduce a size of a photoelectric conversion device, and a prism or a diffraction grating is used for separating wavelengths so as to utilize a photoelectric conversion device suitable for each wavelength.

However, the above-described technology may increase a space of the light concentration plate in a direction toward the solar light. For a concentration system using a lens or a hyperbolic mirror, a photoelectric conversion device is spaced apart from the lens or the mirror by a focal distance, and thus an additional space for the focal distance may be required by the concentration system. In the case of using a prism, a distance for spatially separating wavelength may be required. The above mentioned spatial limitations may make it difficult to implement a photovoltaic power generation system.

SUMMARY

An exemplary solar light concentration plate includes a first hologram which receives solar light and diffracts incident light in a range of an incident angle, and first and second light guides respectively disposed on both sides of the first hologram, wherein at least one of the first and second light guides has an outer surface inclined to an inner surface of the at least one of the first and second light guides.

The first hologram may diffract the incident light at a diffraction angle greater than a critical angle of total reflection of the first and second light guides.

The first hologram may cause diffraction to light which has a wavelength range ($\Delta\lambda$).

The wavelength range ($\Delta\lambda$) may be about 10 nanometers (nm) to about 300 nm.

Each of the first and second light guides may have an outer surface of inclined to an inner surface of each of the first and second light guides.

An angle made by the outer surfaces of the first and second light guides may be about 1 degree to about 10 degrees.

The first hologram may include a phase hologram.

A thickness of the first hologram may be equal to or greater than about 1 micron ($\mu$m).

The first hologram may select, diffract, and/or separate a portion which has a predetermined wavelength range from the incident light.

The solar light concentration plate may further include at least one second hologram aligned substantially parallel to the first hologram.

Another exemplary solar light concentration plate includes a plurality of holograms which receives solar light and diffracting incident light in a range of an incident angle, at least one intermediate light guide disposed between the plurality of holograms, and a pair of outer light guides disposed on outer surfaces of outermost holograms among the plurality of holograms, wherein at least one of the outer light guides has an outer surface substantially inclined to an inner surface of the at least one of the outer light guides.

The plurality of holograms as a whole may diffract the incident light at a diffraction angle greater than a critical angle of total reflection of the outer light guides.

At least one of the plurality of holograms may cause diffraction to light which has a wavelength range ($\Delta\lambda$).

The wavelength range ($\Delta\lambda$) may be about 10 nm to about 300 nm.

Each of the outer light guides may have an outer surface of inclined to an inner surface of each of the outer light guides.

An angle made by the outer surfaces of the outer light guides may be about 1 degree to about 10 degrees.

At least one of the plurality of holograms may include a phase hologram.

A thickness of at least one of the plurality of holograms may be equal to or greater than 1 $\mu$m.

At least one of the plurality of holograms may select, diffract, and/or separate a portion which has a predetermined wavelength range from the incident light.

The plurality of holograms may be aligned substantially parallel to each other.

An angle range of diffraction generation may decrease as a number of the plurality of holograms increases.

DETAILED DESCRIPTION

Figure 1:
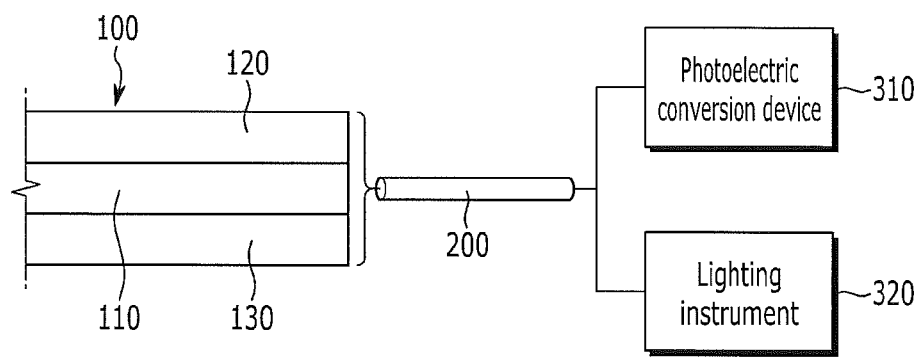
FIGS. 1 to 3 are cross-sectional views of solar light concentration plates according to exemplary embodiments.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope. In the drawing, parts having no relationship with the explanation are omitted for clarity, and the same or similar reference numerals designate the same or similar elements throughout the specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described in further detail with reference to the accompanying drawings.

A solar light concentration plate according to an exemplary embodiment is described in detail with reference to FIGS. 1 to 3.

Figure 2:
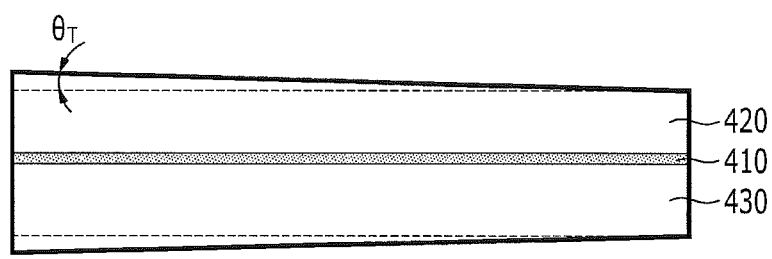
Figure 3:
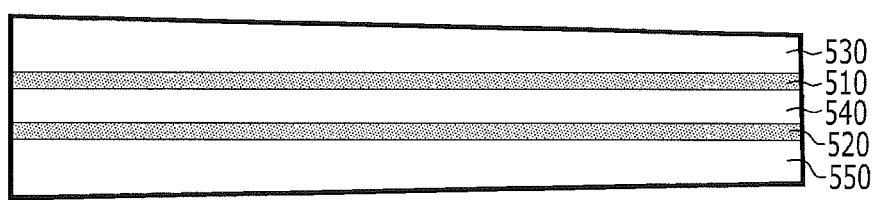

FIGS. 1 to 3 are cross-sectional views illustrating exemplary embodiments of solar light concentration plates.

Referring to FIG. 1, a solar light concentration plate 100 includes a hologram 110, and upper and lower light guides 120 and 130 attached to upper and lower surfaces of the hologram 110, respectively. In one exemplary embodiment, the concentration plate 100 may have various shapes such as, for example, a triangle, a quadrangle, an oval, and the like.

In one exemplary embodiment, each of upper and lower light guides 120 and 130 may have a shape of a plate and include a transparent plastic film, for example. In one exemplary embodiment, the plastic film may have a refractive index of about 1.5, and in the present exemplary embodiment, a critical angle of the total reflection for light toward air from the light guides 120 and 130 is about 42 degrees. In general, a refractive index of a plastic light guide plate is within a range of about 1.3 to about 1.7, and the critical angle is determined in the range of about 50 degrees to 36 degrees according to Snell's law. However, a material for the light guides 120 and 130 is not limited thereto as long as the material may guide light.

In one exemplary embodiment, the hologram 110 may be a volume phase hologram and diffract incident light having a wavelength of a determined range which enters at an incidence angle of a determined range, at an angle of a determined range. In one exemplary embodiment, the hologram 110 may include a diffraction grating, and may be recorded using interference of coherent light such as laser, for example. According to the present exemplary embodiment, the hologram 110 may be recorded with laser, and the incident light is solar light when using the light guide plate.

In one exemplary embodiment, the hologram 110 and the light guides 120 and 130 may be attached with an index matching adhesive to prevent scattering at an interface therebetween.

In one exemplary embodiment, the concentration plate 100 may be connected to an optical fiber 200, which may be connected to a photoelectric conversion device 310 and/or a lighting instrument 320. The concentration plate 100 collects incident solar light and sends it to the photoelectric conversion device 310 or the lighting instrument 320 through the optical fiber 200, and the light may be converted into electricity by the photoelectric conversion device 310 or directly used as a direct lighting by the lighting instrument 320.

In one exemplary embodiment, the concentration plate 100 may be directly connected to the photoelectric conversion device 310.

Referring to FIG. 2, a solar light concentration plate 400, substantially similar to the exemplary embodiment shown in FIG. 1, includes upper and lower light guides 420 and 430, and a hologram 410 disposed therebetween.

However, differently from the exemplary embodiment shown in FIG. 1, each of the light guides 420 and 430 has an outer surface that is not parallel to an inner surface of the light guides 420 and 430 but inclined relative to the inner surface of the light guides 420 and 430. That is, the outer surface (or a top surface) and the inner surface (or a bottom surface) of the upper light guide 420 make a tilt angle $\theta_T$, and the outer surface (or a bottom surface) and the inner surface (or a top surface) of the lower light guide 430 also make the tilt angle $\theta_T$. In one exemplary embodiment, the angle $\theta_T$ may be greater than zero degree and smaller than about ten degrees, for example, from about one degree to about five degrees. In FIG. 2, a thicker left portion of the solar light concentration plate 400 may be connected to an optical fiber (not shown).

Referring to FIG. 3, a solar light concentration plate includes two holograms 510 and 520 and three light guides 530, 540 and 550. The holograms 510 and 520 are aligned substantially parallel to each other, and among the three light guides 530, 540 and 550, upper and lower light guides 530 and 550 have outer surfaces that are not parallel to inner surfaces of the upper and lower light guides 530 and 550, while a middle light guide 540 has top and bottom surfaces substantially parallel to each other.

Now, exemplary embodiments of operating principles of the solar light concentration plates are described below in detail.

First, exemplary embodiments of an operating principle of volume phase hologram are described in detail with reference to FIGS. 4 to 8.

Figure 4:
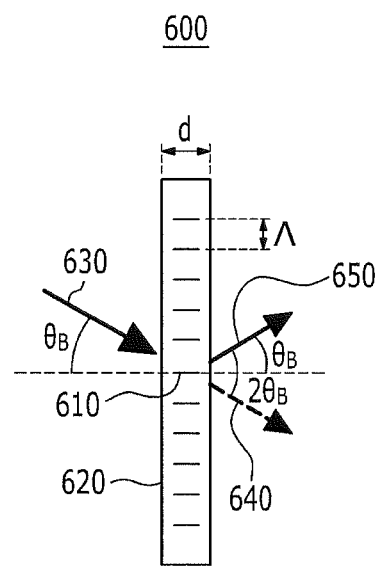
FIGS. 4 and 5 are schematic diagrams respectively illustrating Bragg diffraction and Raman-Nath diffraction of an exemplary embodiment of the diffraction grating.
Figure 5:
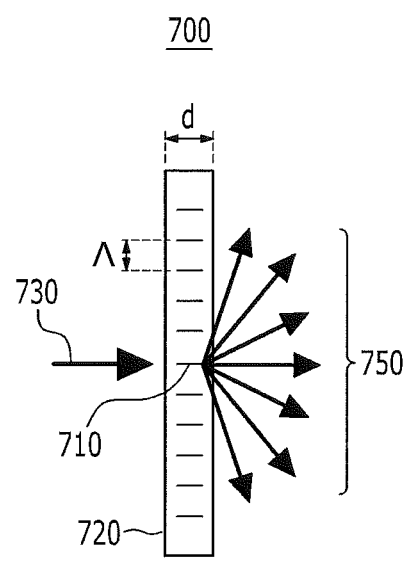
Figure 6:
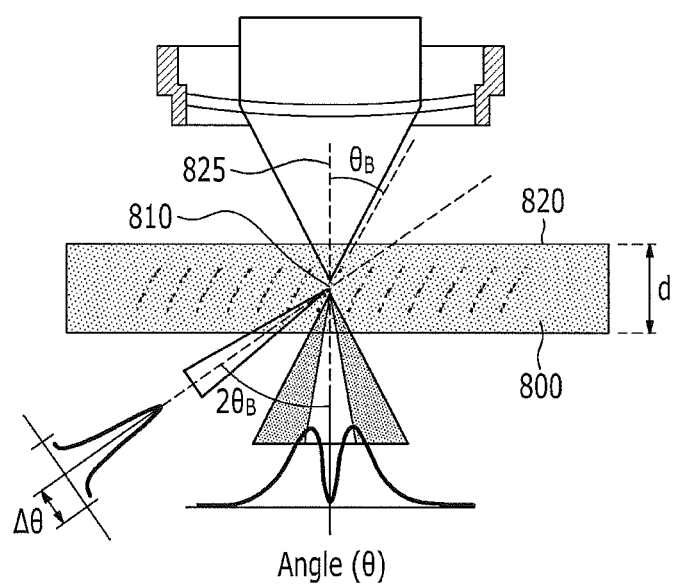
FIGS. 6 and 7 are schematic diagrams respectively illustrating an exemplary embodiment of angular selectivity and wavelength selectivity of the diffraction grating.
Figure 7:
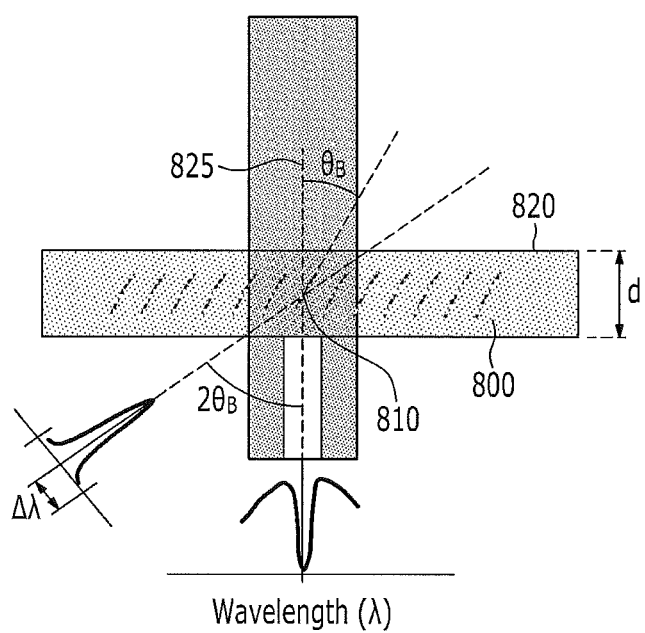
Figure 8:
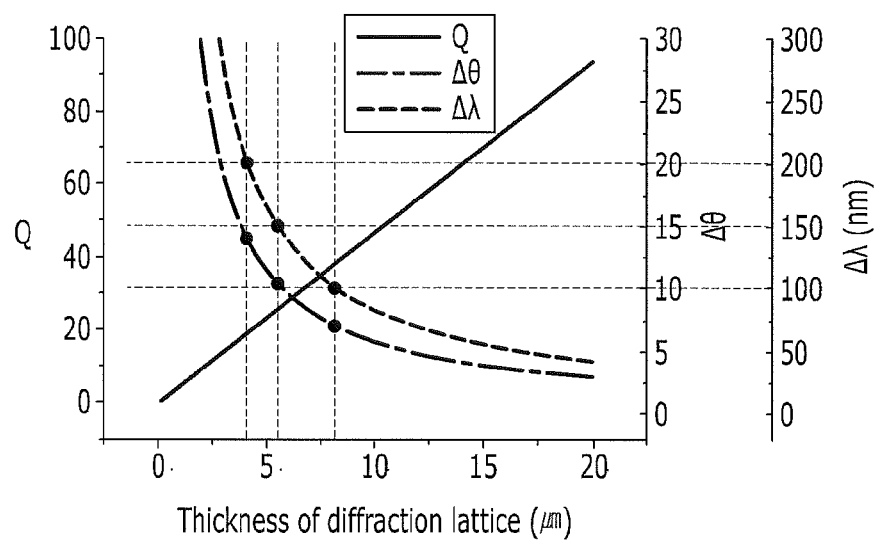
FIG. 8 is a graph showing parameters Q, Δθ and Δλ as a function of a thickness of the diffraction grating when a center wavelength is about 500 nanometers (nm) and Bragg angle is about 22 degrees.

FIGS. 4 and 5 respectively illustrate an exemplary embodiment of Bragg diffraction and Raman-Nath diffraction of a diffraction grating, FIGS. 6 and 7 respectively illustrate an exemplary embodiment of angular selectivity and wavelength selectivity of the Bragg diffraction grating, and FIG. 8 illustrates a graph showing parameters Q, Δθ and Δλ as a function of a thickness of the diffraction grating when a center wavelength is about 500 nm and Bragg angle is about 22 degrees.

FIGS. 4 and 5 show plate-like diffraction gratings 600 and 700, respectively, which are exemplary embodiments of one-dimensional phase holograms. Grating axes 610 and 710 of the diffraction gratings 600 and 700, respectively, are substantially perpendicular to surfaces 620 and 720 of the diffraction gratings 600 and 700, respectively. Two kinds of diffractions are generated by the diffraction gratings 600 and 700. One is Bragg diffraction shown in FIG. 4, which is predominantly generated by a thicker diffraction grating 600, and the other is Raman-Nath diffraction shown in FIG. 5, which is predominantly generated by a thinner diffraction grating 700.

Referring to FIG. 4, Bragg diffraction allows incident light 630 that enters at a given incident angle called Bragg angle $\theta_B$ relative to the grating axis 610 to be diffracted, and one outgoing light 650 is admitted. The outgoing light 650 complies with a law of diffraction to make an angle substantially equal to Bragg angle $\theta_B$ relative to the grating axis 610. Thus, an angle between an extension 640 of the incident light 630 and the outgoing light 650 becomes twice the Bragg angle $2\theta_B$.

Referring to FIG. 5, according to Raman-Nath diffraction, a specific incidence angle is not required to generate diffraction, and a plurality of diffracted outgoing lights 750 is generated from one incident light 730.

To distinguish a type of diffraction performed by a diffraction grating, a parameter Q is introduced. The parameter Q is defined by the following equation 1;

$$Q = \frac{2\pi \lambda d}{\Lambda^2 n_0},$$ <Equation 1> wherein λ is a wavelength, d is the thickness of a diffraction grating, Λ is a pitch distance of a refractive index (or absorption) modulation, and $n_0$ is average refractive index. Generally, a diffraction grating with Q value more than 10 shows Bragg diffraction, and a diffraction grating with Q value of significantly less than 1 shows Raman-Nath diffraction.

To substantially easily control diffracted light, in the present exemplary embodiment, a Bragg diffraction grating that has angular selectivity and wavelength selectivity may be used. The characteristics will be further described in detail with reference to FIGS. 6 and 7.

FIGS. 6 and 7 show a diffraction grating 800 wherein a grating axis 810 is inclined at a Bragg angle $\theta_B$ relative to a surface normal 825 of a surface 820 of the diffraction grating 800. FIG. 6 shows incident light entering at various incidence angles, and FIG. 7 shows incident light of various wavelengths.

Referring to FIG. 6, angular selectivity refers to a characteristic that diffraction is generated for an incidence angle in a limited range around Bragg angle $\theta_B$, wherein a minimum deviation angle at which diffraction is not generated or a maximum angle range $\Delta\theta$ where diffraction can be generated is defined by the following equation 2;

$$\Delta\theta = \frac{n\lambda}{2d\sin\theta_B}, \qquad \text{<Equation 2>}$$

wherein $\lambda$ is a wavelength, d is the thickness of a diffraction grating 800, and $\theta_B$ is Bragg angle. The angular range of diffraction generation $\Delta\theta$ can be adjusted from about 0.001 degrees to about 10 degrees. However, it is noted that substantially too large an angular selectivity $\Delta\theta$ may make a thickness of a diffraction grating 800 small, thereby making Q value substantially too small to enter into a Raman-Nath diffraction region.

Referring to FIG. 7, the wavelength selectivity refers to a characteristic that diffraction occurs for a limited wavelength range, wherein the wavelength range $\Delta\lambda$ that can be diffracted is defined by the following equation 3;

$$\Delta\lambda = \frac{\lambda^2 \cos\theta_B}{2d\sin^2\theta_B}, \qquad \text{<Equation 3>}$$

wherein $\lambda$ is a wavelength, d is the thickness of a diffraction grating 800, and $\theta_B$ is a Bragg angle.

As shown in the above-described equations 2 and 3, the angular selectivity and wavelength selectivity depend on the wavelength $\lambda$, the thickness d of a diffraction grating 800, and a Bragg angle $\theta_B$. For instance, thicker the diffraction grating 800 becomes, larger the angular selectivity and wavelength selectivity becomes, resulting in smaller $\Delta\theta$ and $\Delta\lambda$.

FIG. 8 is a graph showing the parameters Q, $\Delta\theta$ and $\Delta\lambda$ as a function of the thickness of a diffraction grating, when a center wavelength is substantially equal to 500 nm, and Bragg angle is substantially equal to 22 degrees.

In one exemplary embodiment, when the wavelength range for diffraction generation $\Delta\lambda$ is 150 nm, for example, a thickness of a diffraction grating for satisfying the wavelength range $\Delta\lambda$ is about 5.5 microns (μm). In the present exemplary embodiment, an angle range for diffraction generation $\Delta\theta$ may be about 11 degrees, and the parameter Q may be about 25.

In one exemplary embodiment, when a wavelength range for diffraction generation $\Delta\lambda$ is 100 nm, a thickness of a diffraction grating may be about 7 μm, an angle range for diffraction generation $\Delta\theta$ may be about 7 degrees, and the parameter Q may be about 20.

The light concentration plates according to exemplary embodiments include the above described diffraction grating or volume phase hologram, and the operation of the light concentration plates will be described in detail.

Exemplary embodiments of an operation of the solar light concentration plate shown in FIG. 1 are described in detail with reference to FIGS. 9 and 10.

Figure 9:
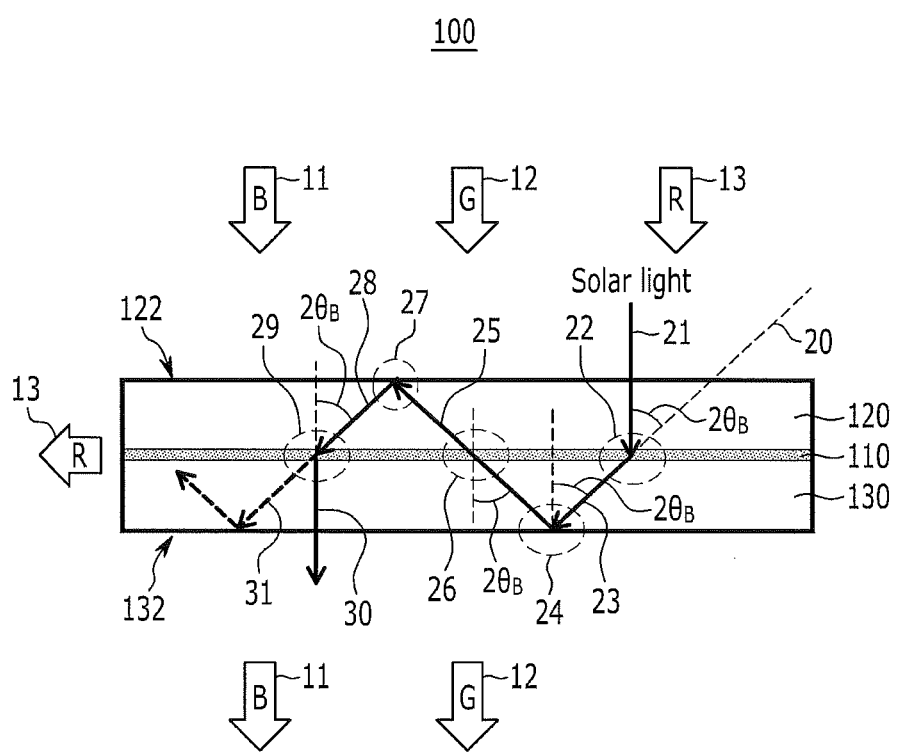
FIGS. 9 and 10 are schematic cross-sectional views illustrating an exemplary embodiment of operation of the solar light concentration plate shown in FIG. 1.
Figure 10:
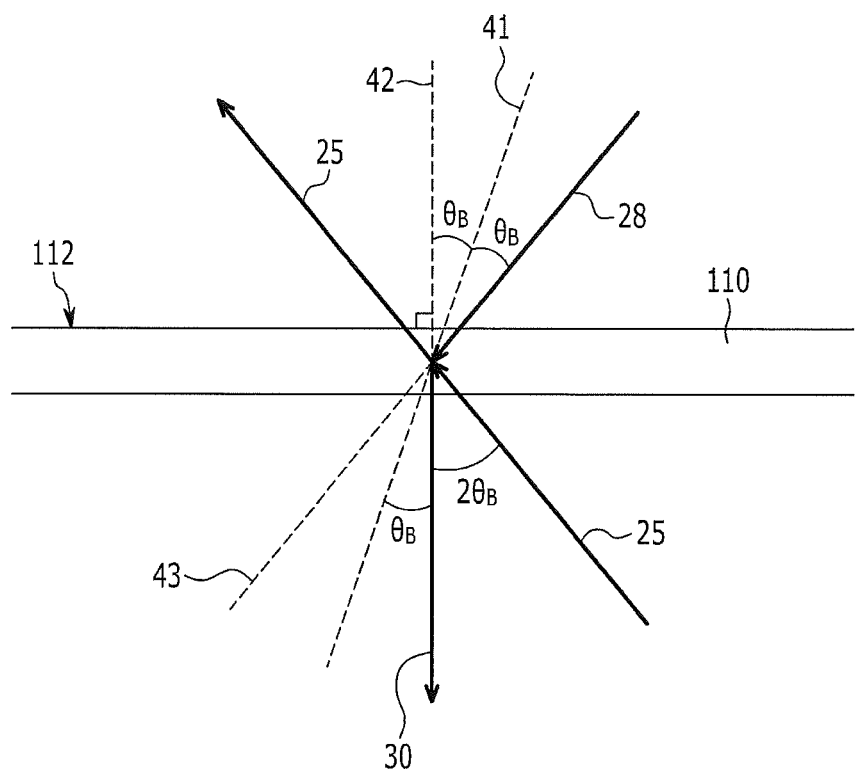

FIGS. 9 and 10 are schematic cross-sectional views illustrating exemplary embodiments of an operation of the solar light concentration plate shown in FIG. 1.

Referring to FIG. 9, the Bragg angle of a hologram 110 is determined larger than half a critical angle of total reflection of the light guides 120 and 130 that are respectively attached to both sides of the hologram 110, i.e., an upper side and a lower side of the hologram 110, and a grating axis of the hologram 110 is made inclined at Bragg angle relative to a surface normal of the hologram 110, as shown in FIGS. 6 and 7. A center wavelength may be selected by adjusting a wavelength or incidence angle of recording light for the hologram 110. In one embodiment, from white solar light, a red wavelength may be exclusively diffracted and other wavelengths may be transmitted, for example. A wavelength range where diffraction can be generated and a minimum deviation angle may be also selected by adjusting a thickness of hologram 110. An effective range of the minimum deviation angle will be described later.

In an exemplary embodiment, it is supposed that solar light 21 including blue light 11, green light 12, and red light 13 is incident on a concentration plate 100 substantially at a right angle, the incident light 21 passes through the upper light guide 120 without changing its direction to reach the hologram 110. The hologram 110 selects the red light 13 from the incident light 21 to be diffracted to a reference direction 20 at twice the Bragg angle 2θB (22), and passes the blue light 11 and the green light 12 without changing their directions. Since Bragg diffraction has wavelength selectivity, it may diffract a selected wavelength range. Bragg diffracted light 23 reaches an interface 132 between the lower light guide 130 and air, and is totally reflected at the interface 132 (24) since the incidence angle 2θB is larger than a critical angle of the light guide 130.

Light 25 totally reflected at the interface 132 between the light guide 130 and air meets the hologram 110 again, and passes through the hologram 110 without experiencing a diffraction (26), which is further described in detail with reference to FIG. 10.

Referring to FIG. 10, when a grating axis 41 is inclined at Bragg angle $\theta_B$ to a surface normal 42 of a surface 112 of a hologram 110, the hologram 110 causes diffraction for two incident directions that make Bragg angle $\theta_B$ with the grating axis 41. One of them is a perpendicular direction 42 (that is substantially parallel to the surface normal 42 and thus denoted by the same reference numeral), the other is a direction denoted by a reference numeral 43 (hereinafter also referred to as a "reference direction"). Light entering at an incidence angle other than the perpendicular direction 42 and the reference direction 43 may not be diffracted. Therefore, since the light 25 totally reflected at the interface 132 between the lower light guide 130 and air enters into the hologram 110 at an incidence angle other than the perpendicular direction 42 and the reference direction 43, it passes through the hologram 110 without experiencing diffraction.

The light 25 that passed through the hologram 110 enters into the upper light guide 120 and advances to meet an interface 122 between the upper light guide 120 and air. At this time, since the incidence angle is substantially equal to 2θ$_B$ and greater than a critical angle of the light guide 120, the light 25 is also totally reflected at the interface 122 (27). Through the above-described process, the perpendicular incident light 21 entering into the concentration plate 100 begins to be guided toward one direction, i.e., leftward direction of the concentration plate 100.

When light 28 totally reflected at the interface 122 between the upper light guide 120 and air meets the hologram 110 experiences diffraction (29) to be guided in a substantially downward direction (30) and may get out of the concentration plate 100.

Referring to FIGS. 9 and 10, the light 28 totally reflected at the interface 122 between the upper light guide 120 and air enters the hologram 110 substantially in the reference direction 43. Therefore, the light 28 diffracted by the hologram 110 goes along the substantially perpendicular direction 42. Therefore, the diffracted light 30 may go downward to get out of the concentration plate 100.

In one exemplary embodiment, in order that the light 28 totally reflected at the interface 122 between the upper light guide 120 and air may be propagated continuously without getting out of the concentration plate 100, the light 28 may go straight toward the direction denoted by reference numeral 31 without being diffracted by the hologram 110.

An exemplary embodiment of an operation of the solar light concentration plate shown in FIG. 2 is described with reference to FIG. 11 and FIG. 12.

Figure 11:
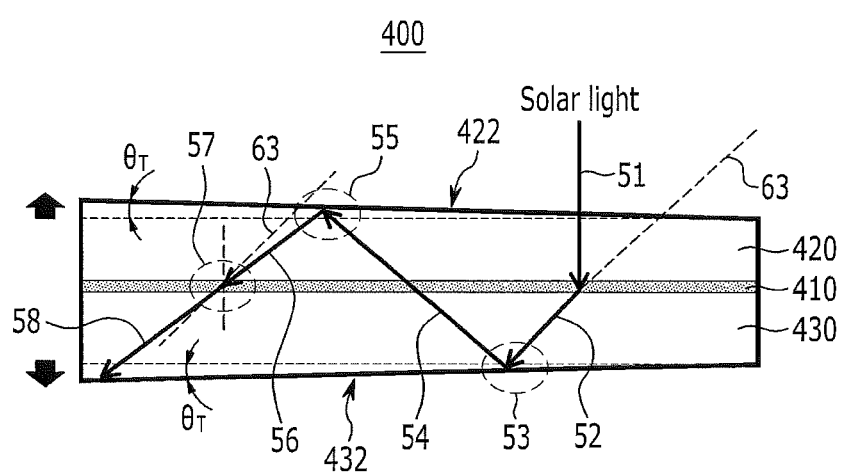
FIGS. 11 and 12 are schematic cross-sectional views illustrating an exemplary embodiment of light propagation in the solar light concentration plate shown in FIG. 2.
Figure 12:
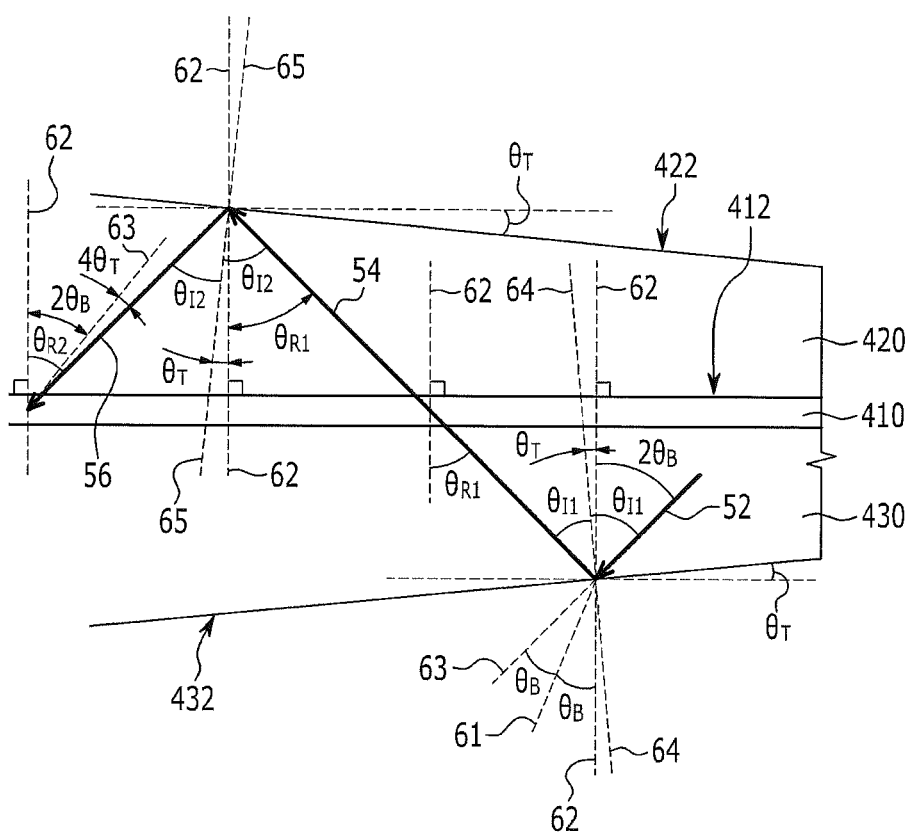

FIG. 11 and FIG. 12 are schematic cross-sectional views illustrating an exemplary embodiment of a light propagation in the solar light concentration plate shown in FIG. 2.

Referring to FIG. 11, a tilt angle $\theta_T$ of upper and lower light guides 420 and 430 relative to a horizontal axis, e.g., upper and lower surfaces of a hologram 410, is greater than a quarter of the angular selectivity $\Delta\theta$ of the above-described diffraction grating or hologram 410.

In the present exemplary embodiment, perpendicularly entering incident light 51 passes through the upper light guide 420 without significant change in the progressing direction to reach the hologram 410, and it is diffracted to the reference direction 63. Since an upper surface of the upper light guide 420 is slightly tilted relative to the horizontal axis, the incident light 51 may experience slight refraction when the incident light 51 enters the upper light guide 420 from air, and thus progressing direction of the incident light 51 may be substantially slightly out of the perpendicular direction when the light 51 enters the hologram 410. However, such refraction may be ignored for better comprehension and ease of description because such refraction may be corrected when recording the hologram or be within angular selectivity range.

Light 52 diffracted by the hologram 410 passes through the lower light guide 430 and totally reflected at an interface 432 between the lower light guide 430 and air (53). Totally reflected light 54 passes through the hologram 410 without diffraction, enters the upper light guide 420, reaches an interface 422 between the upper light guide 420 and air, and may be totally reflected at the interface 422 (55). The twice totally reflected light 56 meets the hologram 410 again, and at this time, since the incidence angle of the twice totally reflected light 56 entering the hologram 410 is greater than angular selectivity around reference direction 63, the light 56 passes through the hologram 410 without experiencing diffraction. As a result, the incident light repeats this process and is propagated to one end of the concentration plate 400, i.e., leftward direction.

The above mentioned process will be further described in detail with reference to FIG. 12.

Referring to FIG. 12, when a direction perpendicular to the upper surface 412 of the hologram 410 is referred to as a "perpendicular-to-hologram direction" 62, the light 52 diffracted by the hologram 410 may advance in the reference direction 63, an angle between the reference direction 63 and the grating axis 61 of the hologram 410 may be equal to $\theta_B$, and an angle between the reference direction 63 and the perpendicular-to-hologram direction 62 may be $2\theta_B$, wherein $\theta_B$ is a Bragg angle.

When a direction perpendicular to the interface 432 between the lower light guide 430 and air is referred to as a "perpendicular-to-lower-light-guide direction" 64, the perpendicular-to-lower-light-guide direction 64 may tilt at an angle $\theta_T$ to the perpendicular-to-hologram direction 62. The incident angle $\theta_{I1}$ at which the diffracted light 52 enters the interface 432 is measured from the perpendicular-to-lower-light-guide direction 64, as represented by the following equation 4;

$$\theta_{I1}=2\theta_B+\theta_T. \qquad \text{<Equation 4>}$$

Light 54 reflected at the interface 432 may also make an angle of $\theta_{I1}$ relative to the perpendicular-to-lower-light-guide direction 64 according the law of reflection.

An incidence angle $\theta_{R1}$ at which the light 54 reflected at the interface 432 reenters the hologram 410 should be measured from the perpendicular-to-hologram direction 62 instead of the perpendicular-to-lower-light-guide direction 64, as represented by the following equation 5;

$$\theta_{R1}=\theta_{I1}+\theta_T=(2\theta_B+\theta_T)+\theta_T=2\theta_B+2\theta_T. \qquad \text{<Equation 5>}$$

Since the incidence angle $\theta_{R1}$ is far from the perpendicular-to-hologram direction 62 and the reference direction 63, the light 54 progressing in this direction may pass through the hologram 410 without experiencing diffraction.

An incidence angle $\theta_{I2}$ at which the light 54 after passing through the hologram 410 enters the interface 422 between the upper light guide 420 and air should be measured from a "perpendicular-to-upper-light-guide direction" 65 that is perpendicular to the interface 422 between the upper light guide 420 and air. Since the perpendicular-to-upper-light-guide direction 65 tilts at an angle $\theta_T$ with reference to the perpendicular-to-hologram direction 62 in the opposite direction to the perpendicular-to-lower-light-guide direction 64, the incidence angle $\theta_{I2}$ is calculated by the following equation 6;

$$\theta_{I2}=\theta_{R1}+\theta_T=(2\theta_B+2\theta_T)+\theta_T=2\theta_B+3\theta_T. \qquad \text{<Equation 6>}$$

Furthermore, the light 56 reflected by the interface 422 may also make an angle of $\theta_{I2}$ to the perpendicular-to-upper-light-guide direction 65.

The incidence angle $\theta_{R2}$ at which the light 56 reflected by the interface 422 reenters the hologram 410 is measured from the perpendicular-to-hologram direction 62, as represented by the following equation 7;

$$\theta_{R2}=\theta_{I2}+\theta_T=(2\theta_B+3\theta_T)+\theta_T=2\theta_B2\theta_T. \qquad \text{<Equation 7>}$$

Therefore, when $4\theta_T$ is greater than angular selectivity $\Delta\theta$ of the hologram 410, the light 56 passes through the hologram 410 without experiencing diffraction.

In one exemplary embodiment, only one of the two light guides 420 and 430 may be inclined based on the above principle.

Meanwhile, the wavelength selectivity (or the wavelength range of diffraction generation) $\Delta\lambda$ of 150 nm may mean that diffraction efficiency for the light having a wavelength deviating 150 nm from center wavelength may become zero. For example, an entire range including a shorter wavelength range and a longer wavelength range with reference to the center wavelength may be 300 nm. However, when substantially effective diffraction efficiency is about an half of maximum diffraction efficiency and thus the wavelength range decreases by half, light within about 150 nm range is substantially diffracted and satisfies light guide condition. Based on this reference to wavelength selectivity, in one exemplary embodiment, the wavelength selectivity $\Delta\theta$ may be about 11 degrees, and the tilt angle $\theta_T$ shown in FIGS. 2 and 11 may be about three degrees, for example, but are not limited thereto. Supposing that a length of the concentration plate 400 is 300 millimeters (mm), the difference between the thicknesses of the thickest portion and the thinnest portion in one of the light guides 420 and 430 is equal to about 15 mm, and the thickness difference between a sum of the thickest portion of the two concentration plates 420 and 430 and a sum of the thinnest portion of the two concentration plates 420 and 430 is equal to about 30 mm. Therefore, the concentration plate 400 may become thicker with relative to its length or area.

A thick concentration plate 400 may cause loss in the light transmission from the concentration plate 400 to the optical fiber 200, and increase manufacturing costs.

The tilt angle $\theta_T$ may be substantially decreased to reduce the thickness of the concentration plate 400, and the angular selectivity of the hologram 410 may be substantially reduced to substantially decrease the tilt angle $\theta_T$.

The embodiment shown in FIG. 3 uses a plurality of holograms to reduce angular selectivity.

Then, an exemplary embodiment of an operation of the solar light concentration plate shown in FIG. 3 is described in detail with reference to FIGS. 13 to 15.

Figure 13:
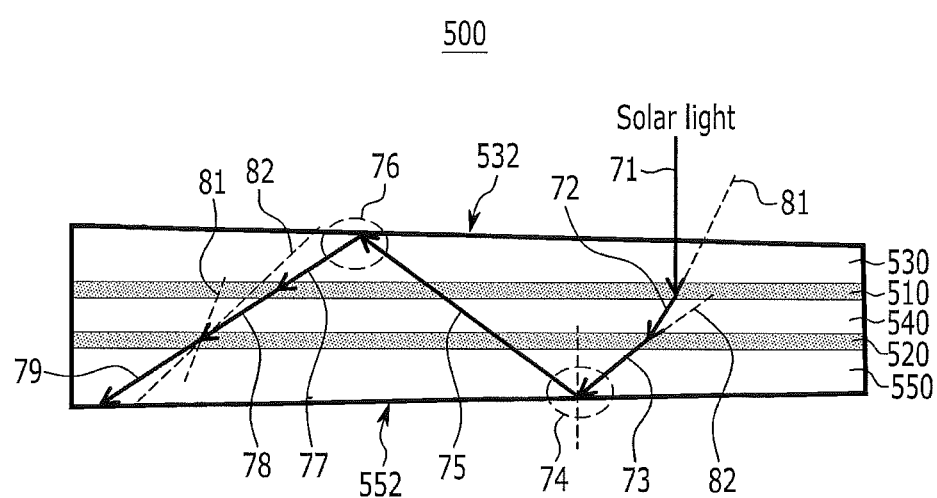
FIG. 13 is a schematic cross-sectional view illustrating an exemplary embodiment of operation of the concentration plate shown in FIG. 3.
Figure 14:
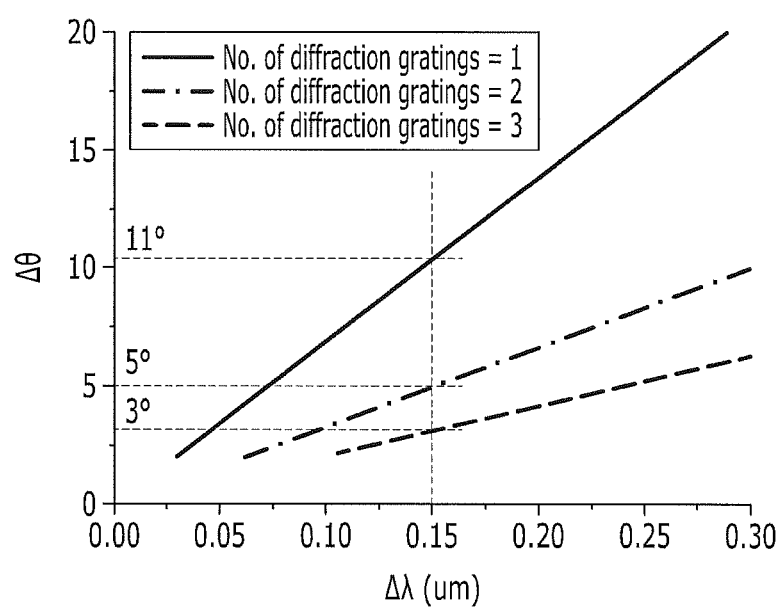
FIG. 14 is a graph showing change in angular selectivity when using one to three diffraction gratings.
Figure 15:
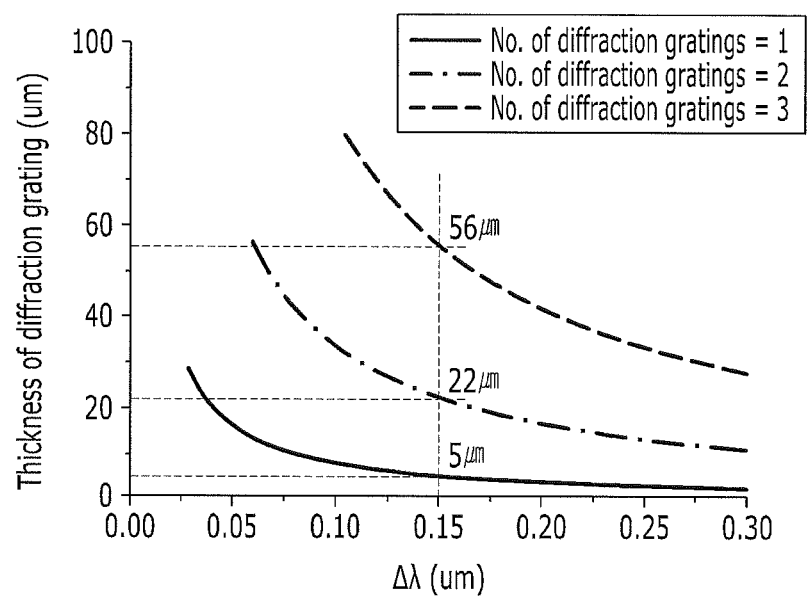
FIG. 15 is a graph showing a thickness of a diffraction grating satisfying a wavelength selectivity of about 150 nm and corresponding angular selectivity.

FIG. 13 is a schematic cross-sectional view illustrating an exemplary embodiment of an operation of the concentration plate shown in FIG. 3, FIG. 14 is a graph showing change in angular selectivity when using one to three diffraction gratings, and FIG. 15 is a graph showing a thickness of a diffraction grating satisfying wavelength selectivity of about 150 nm and corresponding angular selectivity.

Referring to FIG. 13, since upper and lower holograms 510 and 520 are disposed between upper, middle and lower light guides 530, 540, and 550, perpendicular incident light 71 may be firstly diffracted by the upper hologram 510, and firstly diffracted light 72 may pass through the middle light guide 540, and then, be secondly diffracted by the lower hologram 520. Secondly diffracted light 73 may be totally reflected at an interface 552 between the lower light guide 550 and air (74); totally reflected light 75 may pass through the two holograms 510 and 520 without experiencing diffraction and reach an interface 532 between the upper light guide 530 and air. The light 75 may be totally reflected at the interface 532 (76), and totally reflected light 77 may meet and pass through the upper hologram 510 without experiencing diffraction. Light 78 after passing through the upper hologram 510 may pass through the middle light guide 540, and then meet the lower hologram 520, and also pass through it without experiencing diffraction. Light 79 after passing through the lower hologram 520 may be totally reflected at the interface 552 between the lower light guide 550 and air again, and may progress to a leftward direction with repeating the above described process.

In FIG. 13, a diffraction reference direction of the upper hologram 510 is denoted by a reference numeral 81, and a diffraction reference direction of the lower hologram 520 is denoted by a reference numeral 82, wherein a Bragg angle of the holograms 510 and 520 is smaller than that shown in FIG. 12. For example, the dual holograms 510 and 520 each having the Bragg angle of 11 degrees can produce an outgoing light progressing in substantially a same direction as that of the single hologram 410 with the Bragg angle of 22 degrees. It is noted that a direction of the grating axis of the lower hologram 520 may be determined so that the light entering in a diffraction reference direction 81 of the upper hologram 510 instead of a perpendicular direction is diffracted.

According to another exemplary embodiment, a number of holograms may be three or more. The Bragg angle of each hologram decreases as the number of the holograms increases.

FIG. 14 shows change in angular selectivity when using one to three diffraction gratings (or holograms). When the given wavelength selectivity $\Delta\lambda$ is about 150 nm, for example, the angular selectivity of each diffraction grating may decrease from 11 degrees via 5 degrees to 3 degrees as the number of diffraction gratings increases. The reduced value of the angular selectivity $\Delta\lambda$ of each diffraction grating may allow a tilt angle of a light guide to decrease, thereby decreasing a thickness of the light guide.

When a thickness of the thickest portion of the light guide is determined as 10 mm, for example, a length of the light concentration plate may change from about 104 mm for a single lattice structure, via about 227 mm for a double lattice structure, and about 385 mm for a triple lattice structure, which is gradually increasing to widen an area of the concentration plate.

FIG. 15 shows a thickness of a diffraction grating satisfying wavelength selectivity of about 150 nm and corresponding angular selectivity. As a number of the diffraction gratings increases, the Bragg angle may decrease and a diffraction grating may become thicker.

Actually, holograms having a thickness of about 1 μm to about 100 μm can be easily obtained using screen printing or the like, and using roll-to-roll method for mass production.

As described above, according to the present exemplary embodiment, high concentration efficiency and wavelength separation may be enabled while using inexpensive and less space occupying light guide.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A solar light concentration plate comprising:
   a plurality of holograms which receives solar light and diffracts incident solar light having an incident angle;
   at least one intermediate light guide disposed between the plurality of holograms; and
   a pair of outer light guides disposed on outer surfaces of outermost holograms among the plurality of holograms,
   wherein at least one of the outer light guides has an outer surface having a tilt angle substantially inclined to an inner surface of the at least one of the outer light guides which is substantially parallel to an horizontal direction in a cross-section, and
   wherein the outer surface is configured to directly receive the incident solar light from outside of the solar light concentration plate.

2. The solar light concentration plate of claim 1, wherein the plurality of holograms as a whole diffract the incident solar light at a diffraction angle greater than a critical angle of total reflection of the outer light guides.

3. The solar light concentration plate of claim 1, wherein at least one of the plurality of holograms causes diffraction to light which has a wavelength range.

4. The solar light concentration plate of claim 3, wherein the wavelength range is about 10 nanometers to about 300 nanometers.

5. The solar light concentration plate of claim 1, wherein each of the outer light guides has an outer surface inclined to an inner surface of each of the outer light guides.

6. The solar light concentration plate of claim 5, wherein the tilt angle is about 1 degree to about 10 degrees.

7. The solar light concentration plate of claim 1, wherein at least one of the plurality of holograms comprises a phase hologram.

8. The solar light concentration plate of claim 7, wherein the thickness of at least one of the plurality of holograms is equal to or greater than about 1 micron.

9. The solar light concentration plate of claim 1, wherein at least one of the plurality of holograms selects, diffracts, and separates a portion which has a predetermined wavelength range from the incident light.

10. The solar light concentration plate of claim 1, wherein the plurality of holograms is aligned substantially parallel to each other.

11. The solar light concentration plate of claim 10, wherein an angle range of diffraction generation decreases as a number of the plurality of holograms increases.

12. The solar light concentration plate of claim 1, wherein the tilt angle is greater than a quarter of an angular selectivity of the plurality of holograms.

\* \* \* \* \*